Dec. 1, 1959 J. C. McADAM 2,915,637

TUNING SYSTEM FOR TOROID INDUCTORS

Filed Nov. 30, 1953 2 Sheets-Sheet 1

INVENTOR.
JOHN C. McADAM

BY

George E. Pearson
ATTORNEYS

INVENTOR.
JOHN C. McADAM
BY
George E. Pearson
ATTORNEYS

United States Patent Office 2,915,637

Patented Dec. 1, 1959

2,915,637

TUNING SYSTEM FOR TOROID INDUCTORS

John C. McAdam, La Mesa, Calif., assignor to International Electronic Research Corporation, Burbank, Calif., a corporation of California Application November 30, 1953, Serial No. 395,329

10 Claims. (Cl. 250—40)

(Granted under Title 35, U.S. Code (1952), sec. 266)

The invention described herein may be manufactured and used by or for the Government of the United States of America for governmental purposes without the payment of any royalties thereon or therefor.

This invention relates generally to devices or systems for tuning any resonant electronic circuit and more particularly to a tuning system for toroid inductors. Tuning systems have many applications and may be employed, for example, in radio receivers and transmitters, radar and sonar systems, oscillators, tuning circuits, and the like, wherein the capacitance, inductance, "Q," or frequency of the tuned circuit is varied in response to the tuning thereof.

The most frequently used prior art system of tuning an electronic circuit comprises a variable capacitor employed in conjunction with an inductance coil and is generally referred to as capacity tuning. Another prior art system frequently employed is known as slug tuning wherein a slug, usually formed of powdered iron, is moved in and out of a form on which an inductance is wound. While these prior art systems generally have been satisfactory under certain conditions of use, the bulkiness and inordinate size there have rendered the same impracticable for use, for example, in subminiaturizing circuits wherein size is a prime consideration. Furthermore, these systems have limited range in frequency of about 3 to 1 and require the use of several bands on a radio receiver to provide desired frequency coverage.

The use of toroid inductors in electronic circuits provides several advantages among which is the freedom from stray magnetic fields due to the fact that the field in the core of the toroid inductor is confined therewithin. The use heretofore of toroid inductors as the means for tuning electronic systems has not been feasible, however, due to the lack of any method or means for effectively tuning a toroid inductance.

According to the tuning system of the present invention, the frequency range thereof is varied over a wide range of at least 10 to 1 by varying the permeability of the toroid core, and thus the inductance of the coil thereon, under the influence of an external magnetic field.

An object of the present invention is to provide a new and improved system for tuning an electronic circuit.

Another object is to provide a tuning system in which the size thereof may be greatly reduced as compared to conventional capacity tuning systems.

Another object is to provide a tuning system in which the frequency may be varied over a wide band under the influence of a magnetic field.

A further object is to provide a tuning system which may be encapsulated or otherwise contained and remotely tuned without electrical or mechanical connections.

A still further object resides in the provision of new and improved means for adjusting the permeability of the core material of an inductor.

An additional object is to provide variable "Q" by adjustment of the inductance of an inductor and holding the frequency constant with a variable capacitor.

Still another object is to provide means for tuning a toroid inductor.

Yet another object is to control the desired linearity or non-linearity of tuning circuits through the shaping of permanent magnets employed as the tuning means.

Other objects and many of the attendant advantages of this invention will be readily appreciated as the same becomes better understood by reference to the following detailed description when considered in connection with the accompanying drawings wherein.

A tuning system constructed in accordance with the present invention may take many forms depending on the application desired therefor. Basically, the tuning system comprises a toroid inductor 11 and a magnet array which is comprised of either permanent or electromagnets, or a combination of both.

Figure 1:
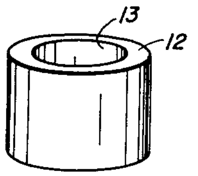
Fig. 1 is a perspective view, approximately eight times actual size of the inductor core employed in the tuning system of the present invention.

The toroid inductor 11 comprises a core 12, Fig. 1, which preferably is formed of a ferrite type material which is characterized by high permeability and high resistivity. The core 12 has the configuration of a hollow cylinder or ring and thus forms a closed toroidal magnetic path about the circumference thereof. In the specific inductor embodiment disclosed herein, the actual core diameter is of the order of ⅛ inch; the central aperture 13 is approximately $\frac{1}{16}$ inch; and the length of the core is about ⅛ inch.

Core 12 has a winding 14 wound thereabout and therethrough of wire which is of the proper size and amount for the inductance desired. In the specific inductor embodiment disclosed herein, winding 12 is wound with 65 turns of number 37 solid copper wire single silk enamel covered.

Figures 3, 4, 5:
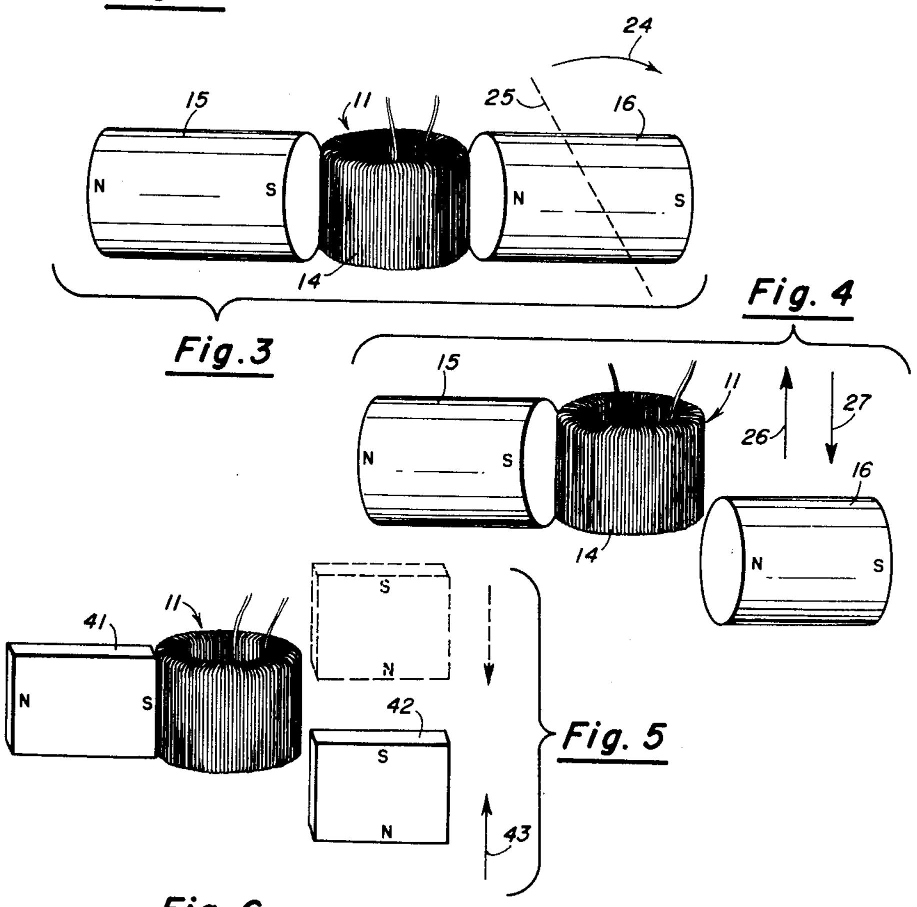
Figs. 3 and 4 are schematic views of one inductor and magnet arrangement in which there is suggested different movements of the adjusting magnets for controlling the influence of the magnetic field on the inductors individual thereto.
Figs. 5 and 6 are views similar to Figs. 3 and 4 and illustrate another inductor and magnet arrangement.
Figures 7, 8, 9, 10, 11:
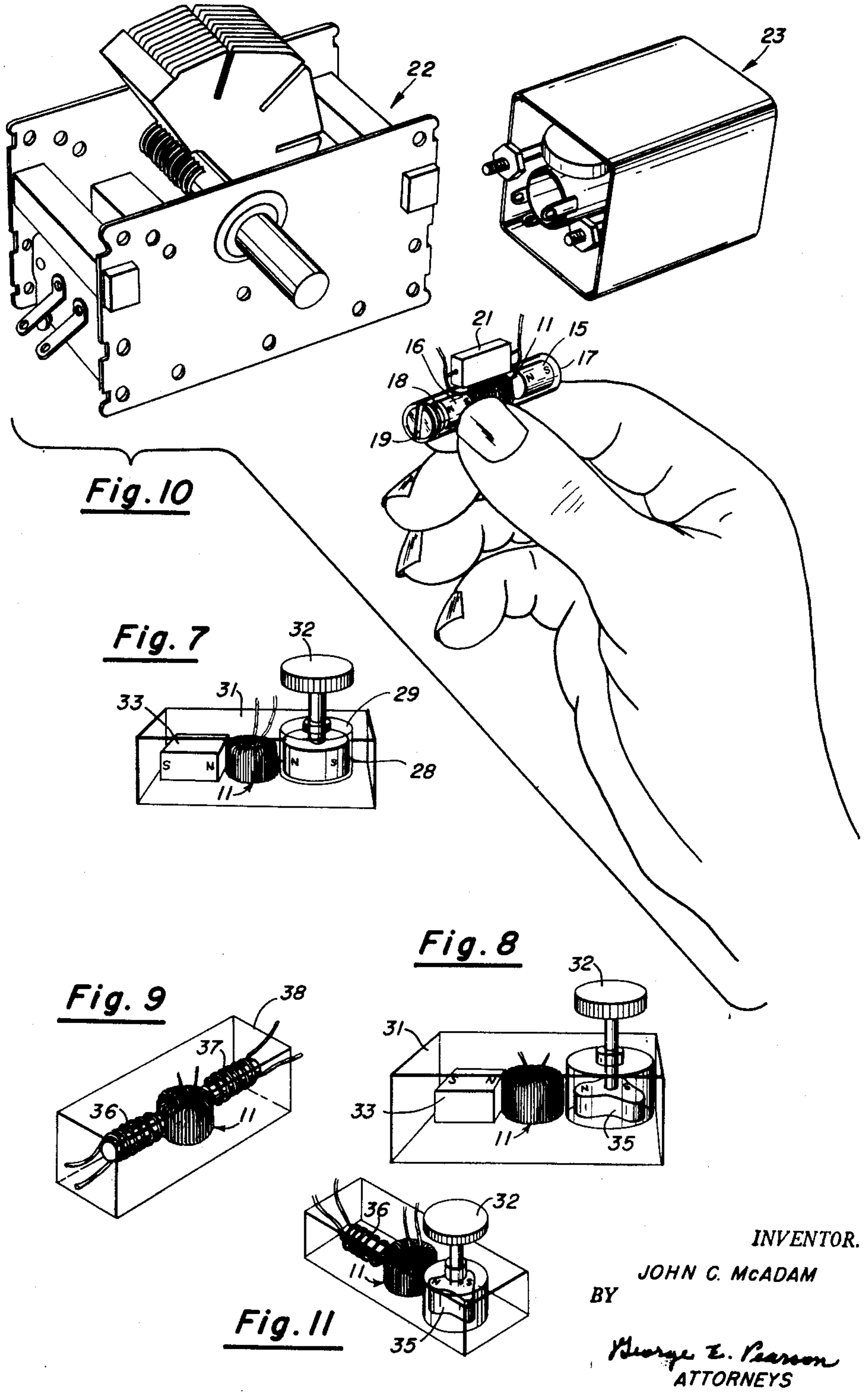
Figs. 7 and 8 are perspective views of embodiments of the tuning system of the present invention wherein different configurations are provided for the adjusting magnets.
Fig. 9 is an embodiment of the tuning system constructed in accordance with the present invention and wherein electromagnets are employed to set up the controlling magnetic field.
Fig. 10 is a perspective view of still another embodiment of the tuning system of the present invention shown in comparative relation to a conventional capacity tuning system in order to illustrate the difference in size therebetween.
Fig. 11 is a view similar to Figs. 8 and 9 and employing a combination of the permanent magnet and electromagnet arrangements disclosed herein.

In each of Figs. 3, 4, and 10, inductor 11 is operatively associated with a pair of small cylindrical permanent magnets 15 and 16 of which magnet 15 is secured in any suitable manner to the inductor 11. This is accomplished in the structural arrangement of Fig. 10, for example, wherein the magnet 15 and inductor 11 are encapsulated in fixed relation to each other within the cylinder 17 which is cast of plastic or other suitable material. In this arrangement, the magnet 16 is secured at one end face thereof as by a suitable cement to the non-magnetic plug 18 which is threadedly received into a central bore provided therefor in cylinder 17 whereby the opposite end face of magnet 16 is advanced toward or withdrawn from inductor 11 as the plug 18 is threadedly advanced or withdrawn within the bore. In order to turn the plug 18 in the bore for this purpose, the plug is provided with a slot 19 for receiving a screw driver or similar tool. It will also be readily appreciated that plug 18 could have a portion extending externally of cylinder 17 which is shaped in the form of a dial to provide for manual hand tuning of the system.

When the arrangement of the magnets is as illustrated in Fig. 10 such that unlike poles lie on opposite sides of inductor 11 and both magnets 15 and 16 abut against the inductor, in contiguous relation thereto, the field is maximum in the space occupied by the inductor and the frequency of the arrangement is the highest obtainable over the range thereof. From this position of magnet 16, the frequency may be decreased progressively by withdrawing magnet 16 from the inductor to increase the spaced relation therebetween.

This arrangement, of course, insofar as obtaining a specific frequency range is concerned, presumes the connection across the inductor of the proper capacitor 21 of fixed value such that the inductor and capacitor constitute a tunable circuit providing a frequency. It will be understood that under certain conditions the distributed capacity of the inductor and circuit capacities may comprise the capacitance in the tuned circuit.

It will be noted from Fig. 10 that the tuned circuit comprising capacitor 21 and inductor 11 occupies only a fraction of the space required by its conventional functional equivalent which may include such parts as the rotary condenser 22 and the shielded coil assembly 23. Moreover, the frequency range of tuning system 22, 23 conventionally is limited to the broadcast band of 500 to 1500 kilocycles, providing a frequency range of 3 to 1, whereas the frequency range of tuning system 11, 21 may be greater than 5 to 1 in the arrangement shown in Fig. 10.

One of the obstacles standing in the way of complete sub-miniaturization of electronic equipment of all kinds arises from the fact that the inordinate size of conventional tuning devices compares unfavorably with the size of other circuit components. The magnetically tuned toroid device as disclosed in Fig. 10, however, can be constructed smaller than sub-miniature type electron tubes and is not out of proportion with other components to be employed therewith in sub-miniaturized equipment. Reduction in size of the tuning system is accompanied by a saving in critical materials and, in view of the wide frequency variation possible, the need for additional coils and band change switches is obviated, these parts heretofore being required in order to provide sufficient frequency coverage in the use of small range tuning devices. With provision for the magnetic influence of the ferrite material of the toroidal core, it is possible to construct a fixed inductance occupying less than 1/32 cubic inch, resonating at 500 kc. and having a "Q" of 100.

In Figs. 3 and 4 there are shown different arrangements for adjustable movements of magnet 16. In Fig. 3, as indicated by the arrow 24, there is contemplated an arrangement wherein magnet 16 is mounted for rotational movement about the axis 25 whereby the N and S poles of the magnet selectively may be moved into contiguous relation with the inductor 11 and thus provide a frequency range in the order of 10 to 1. When like poles of the magnet face each other on opposite sides of inductor 11, the magnetic field is cancelled in the space occupied thereby and the lowest frequency within the available range of the arrangement of Fig. 3 is obtainable therefrom.

In a specific case embodying the arrangement of Fig. 3, the inductor 11 was formed using as the core 12, a small piece of Ferroxcube III tubing 1/8" diameter by 3/16" long with a 1/16" central opening. The winding 14 was wound on this core in toroid manner and consisted of 65 turns of number 37 single cotton covered enamel wire. This toroid inductor had the following characteristics as measured on a Boonton Q meter which is essentially an oscillator with provision for insertion of the inductor externally of the instrument and further provision of meters and dials for reading the inductance and "Q" of the inductor:

| | |
|---|---|
| Frequency ----------kilocycles-- | 790 |
| Q ---------- | 35 |
| Capacity ----------micromicrofarads-- | 36 |
| Inductance ----------millihenrys-- | 1.14 |

When permanent magnets 1/8" diameter and 1/4" long were placed in the arrangement disclosed in Fig. 3 such that the inductor occupied the maximum combined fields of the magnets, the inductor then resonated at 7900 kilocycles, an increase in frequence by a factor of 10. Through adjustment of magnet 16 to vary the strength of the field on the inductor and through selection of the initial inductance of the inductor to suit a desired condition, it is possible to make relative selections of frequency, inductance, impedance and "Q" in the design of an inductor in a manner heretofore not possible. As an example, an inductor which resonated at 500 kc. with 100 mmf. capacity and with a "Q" of 60, when subjected to a magnetic field, resonated at 500 kc. with 500 mmf. capacity and had a "Q" of 100, thus permitting adjustment of the "Q" of a circuit without a change in frequency.

In Fig. 4, there is contemplated an arrangement wherein provision is made for moving magnet 16 transversely of the fixed combination of 11 and 15 as indicated by the arrows 26, 27. In another arrangement functionally similar to that of Fig. 3, magnet 16 is turned 90° such that the longitudinal axis extends parallel to arrows 26, 27 and magnet 16 is then adjusted as indicated by the arrows. With the adjustable magnet in this latter position, there is contemplated another arrangement in which this magnet is magnetized so as to provide diametrically opposed poles and adjustment of the magnet is about its longitudinal axis as illustrated in Fig. 7 wherein magnet 28 is encapsulated in the rotatable plug 29 mounted for rotation in the plastic block 31, a knob 32 being provided to facilitate the adjustment. Inductor 11 and fixed magnet 33 conveniently are encapsulated in fixed mutual relation with the block 31.

As illustrated in Fig. 8, adjustable magnet 35 may be conveniently shaped and magnetized in such a manner as may be necessary to provide a linear or other desired frequency response over the available range.

Fig. 9 discloses design possibilities available when a pair of electromagnets 36 and 37 are encapsulated in fixed relation to the inductor 11 within the block 38. In this arrangement, it will be apparent that the field strength of either or both of magnets 36 and 37 may be varied through control of the current supplied thereto.

Figure 6:
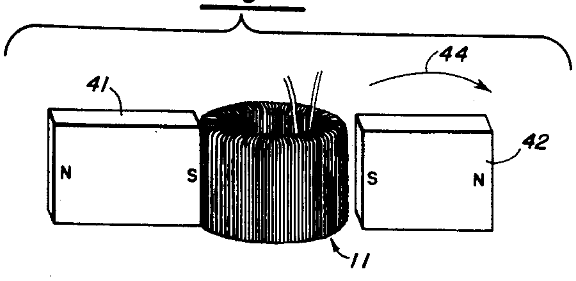

Referring now to Figs. 5 and 6, it may be seen that there is disclosed therein, an arrangement wherein Alnico V permanent magnets 41 and 42 are disposed on either side of inductor 11, these magnets being 1/2 inch square by 5/16 inch thick. This arrangement is generally similar to that disclosed in Figs. 3 and 4. By changing the influencing magnetic field of magnets 41, 42 on inductor 11 from zero to maximum by moving magnet 42 in the direction of arrow 43 to the dashed line position thereof in Fig. 5 or rotating this magnet 180° as indicated by arrow 44 in Fig. 6, it is possible to change the frequency of the tuned circuit of which the inductance is a part, for example, from 500 kc. to 5000 kc. or 1000 kc. to 10,000 kc., depending on the shunt capacity placed across the inductor.

In Fig. 11, an inductor arrangement combining features of the inductor arrangements of Figs. 8 and 9 is disclosed wherein tuning may be accomplished either electromagnetically through control of the current supplied to the coil of electromagnet 36 or by control of the influence of the magnetic field of permanent magnet 35 on inductor 11 through manual adjustment of the knob 32.

Figure 2:
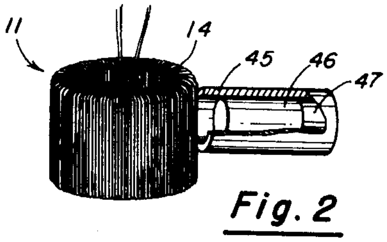
Fig. 2 is a view in perspective of the core of Fig. 1 showing a winding wound thereon and provision of means for trimming the inductance thereof.

In Fig. 2, means are disclosed for trimming the inductance of inductor 11, this means comprising a nonmagnetic tube 45 within which a small permanent magnet 46 is adjusted axially therewithin until the desired value of inductance is obtained, the tube 45 being held by suitable means (not shown) against the inductor in the position shown in Fig. 2. When the desired position of magnet 46 has been found, the magnet may be held in this position as by filling the end of the tube with a suitable sealing compound or cement as indicated at 47.

The nicety of the trimming arrangement of Fig. 2 will readily be appreciated by those skilled in the art in that it obviates the need for adding or removing turns from the inductor winding as heretofore required in order to provide a desired inductance.

It will be further apparent that application of the external field to the inductor as in the present invention operates as bias for reducing or suppressing the effect of variations in permeability and inductance due to changes in applied voltage. Stated otherwise the effect of the external field is to render the permeability of the core material more nearly constant.

Obviously many modifications and variations of the present invention are possible in the light of the above teachings. It is therefore to be understood that within the scope of the appended claims the invention may be practiced otherwise than as specifically described.

What is desired to be secured by Letters Patent of the United States is:

1. A variable inductor comprising a torodial core formed of ferrite material and having a toroidal winding wound thereon, and at least two adjustable magnetic field means disposed externally of the core for selectively varying the permeability thereof, said means setting up within said core magnetic fields which add or cancel selectively in accordance with the adjustment of said field means.

2. A tunable system comprising a capacitor, an inductor having a toroidal winding shunted across said capacitor, a toroidal core for said winding, said core being formed of magnetic material having high permeability to weak fields and having high resistivity, and at least two means disposed externally of the core for selectively varying the permeability thereof under the influence of magnetic fields which selectively add or cancel within the space occupied by said core.

3. A variable inductor comprising a toroidal core of ferrite material, a winding on said core, and at least two external field means diametrically disposed and in opposed relation to said core and adjustable to vary the polarity thereof selectively from like to unlike polarity for setting up a magnetic field in the space occupied by said core which is adjustable from a maximum value of field strength to zero value.

4. A variable inductor comprising a toroidal core of ferrite material, a winding on said core, and a pair of magnets disposed in diametrically opposed relation and with like or unlike polarity selectively on opposite sides of said core.

5. A variable inductor comprising a toroidal core of ferrite material, a winding on said core, a pair of magnets disposed in diametrically opposed relation on opposite sides of said core, means for maintaining one of said magnets in fixed contiguous relation to said core, and means supporting the other magnet for movement of either of the poles thereof selectively into contiguous relation to said core.

6. A variable inductor tuning system comprising a toroidal core of ferrite material, a winding on said core, a pair of magnets disposed on diametrically opposed sides of said core, means for maintaining one of said magnets with one of the poles thereof in fixed contiguous relation to said core, and means rotatively supporting the other of said magnets for movement of either of the poles thereof into contiguous relation to said core, said other magnet being a permanent magnet and having a predetermined configuration providing linear change in frequency as the other pole of the magnet is moved into said contiguous relation to the core.

7. A variable inductor comprising a toroidal core of ferrite material, a winding on said core, a pair of cylindrical permanent magnets disposed on diametrically opposed sides of said core and axially aligned diametrically with the core, means for maintaining one of said magnets in fixed contiguous relation to the core, and means for mounting the other of the magnets for movement of the same toward or away from the core.

8. A variable inductor comprising a toroidal core of ferrite material, a winding on said core, and a pair of electromagnets disposed on diametrically opposite sides of said core and axially aligned diametrically therewith.

9. A variable inductor comprising a toroidal core of ferrite material, a winding on said core, a first magnet having one of the poles thereof disposed in contiguous relation to the circumferential surface thereof, and a second magnet disposed on the opposite side of said core and having the poles thereof arranged along a line perpendicular to a line extending through the poles of said first magnet, said second magnet being arranged for movement thereof to opposite sides of said last named line whereby the combined magnetic field set up by said magnets in the space occupied by said core may be varied between maximum and minimum values of field strength.

10. A variable inductor comprising an annular ferromagnetic core and a toroidal winding disposed thereon, a magnetic circuit adapted to direct flux through said core and including magnets disposed on opposite sides of said core and means for changing the relative positions of said magnets with respect to said core and to each other.

References Cited in the file of this patent

UNITED STATES PATENTS

| | | |
|---|---|---|
| 1,896,510 | Given | Feb. 7, 1933 |
| 2,101,665 | Arey | Dec. 7, 1937 |
| 2,200,263 | De Kramolin | May 14, 1940 |
| 2,222,770 | Hartl | Nov. 26, 1940 |
| 2,380,242 | Jewell | July 10, 1945 |
| 2,503,155 | Harvey et al. | Apr. 4, 1950 |
| 2,611,094 | Rex | Sept. 16, 1952 |
| 2,621,314 | Wendt | Dec. 9, 1952 |
| 2,762,020 | Gordon | Sept. 4, 1956 |
| 2,802,170 | Starr | Aug. 6, 1957 |

FOREIGN PATENTS

| | | |
|---|---|---|
| 60,664 | Denmark | Feb. 22, 1943 |